United States Patent [19]

Levy et al.

[11] 4,376,253

[45] Mar. 8, 1983

[54] TIMED SWITCH FOR AN AC LOAD

[75] Inventors: Alan W. Levy, Agincourt; Attila J. Szanto, Ottawa; Peter C. Wheeler, Embrun, all of Canada

[73] Assignee: Canadian Patents & Dev. Limited, Ottawa, Canada

[21] Appl. No.: 188,949

[22] Filed: Sep. 19, 1980

[51] Int. Cl.³ ............... H03K 5/159; H03K 19/21; H03K 17/60

[52] U.S. Cl. ............................. 307/590; 307/592; 307/470; 307/252 T

[58] Field of Search ............ 307/141.4, 252 T, 597, 307/470, 242 R, 590, 592; 315/360

[56] References Cited

U.S. PATENT DOCUMENTS 3,755,695 8/1973 Krick et al. .................. 307/141.4
3,940,660 2/1976 Edwards ......................... 315/360
3,950,657 4/1976 Sheng et al. .................... 307/597
4,090,107 5/1978 Seib ............................ 307/252 T Primary Examiner—Stanley D. Miller
Assistant Examiner—B. P. Davis
Attorney, Agent, or Firm—Edward Rymek

[57] ABSTRACT

The timed AC switch comprises a manual on-off switch in series with bidirectional semiconductor switch, such as a triac, for connection in a loop with an AC source and a load which would generally be incandescent or fluorescent lamps. The semiconductor switch is driven by an RC oscillator which is under the control of an inhibit circuit and a digital counter which itself is driven by the oscillator. The counter is reset at initial start up, and may also be reset while operating or after counting out. The times switch may also be controlled to inhibit the oscillator for a very short time as a warning before finally timing out.

9 Claims, 2 Drawing Figures

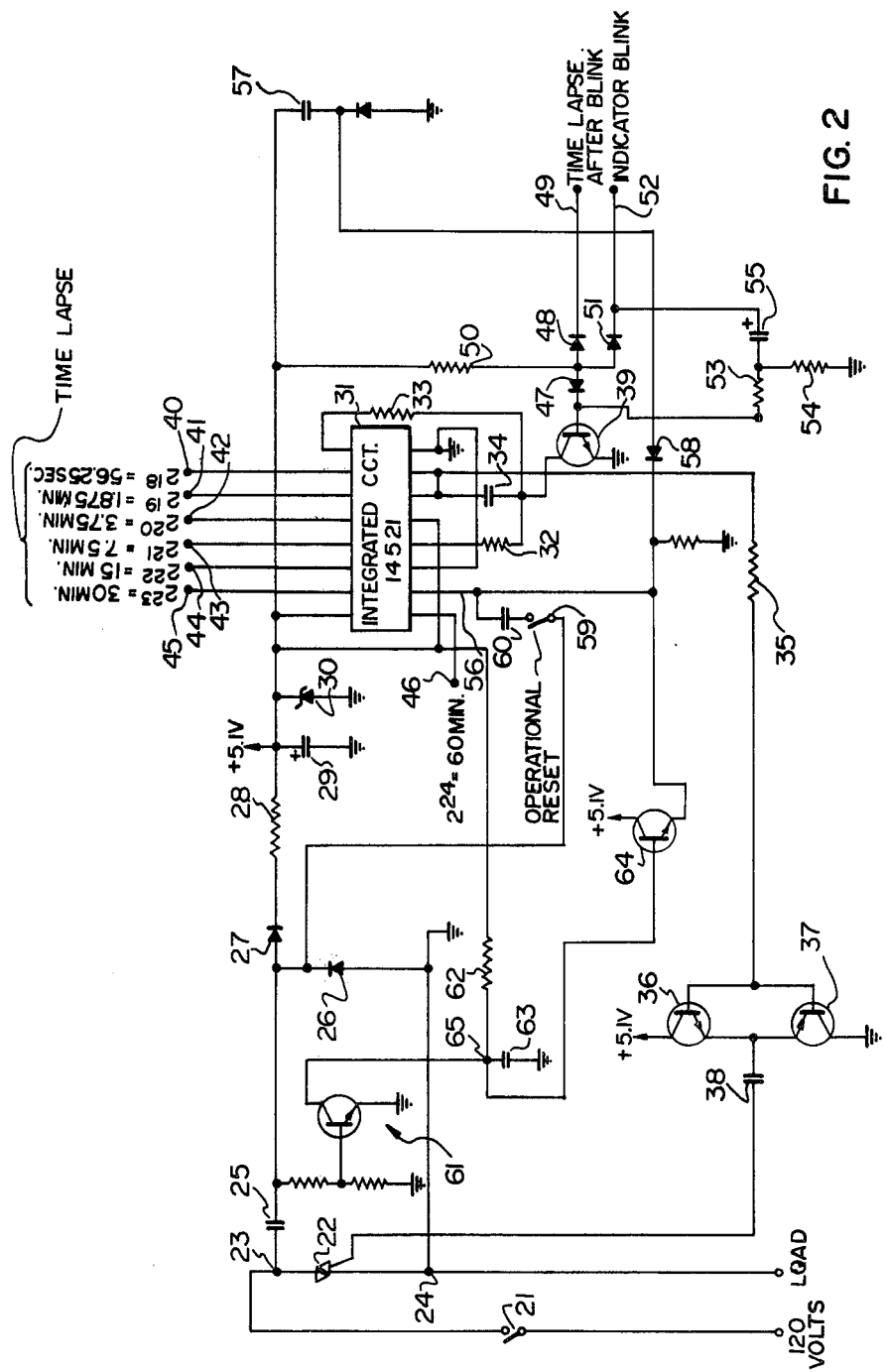

TIMED SWITCH FOR AN AC LOAD

BACKGROUND OF THE INVENTION

This invention is directed to a timed switch for AC loads and in particular to a switching apparatus for disconnecting a load from a source at a preselected time after the load has been energized.

Over the years, an ever increasing need has been felt for a form of wall switch which will automatically turn off the lights in an area which is not occupied. Many timing devices have been developed but are normally found to be complex to install since they require a separate supply of power. A device that does not need a separate supply is described in U.S. Pat. No. 3,940,660 which issued to F. H. Edwards on Feb. 24, 1976. This device is powered from across the triac switch which itself is in series with the load. However, this switch requires a substantial amount of supply power which is absorbed either during a substantial portion of the beginning of each AC cycle or during 1 out of N cycles when the load is not connected to the source. Flickering is apparent in incandescent lamp loads and particularly in fluorescent lamp loads.

SUMMARY OF THE INVENTION

It is therefore an object of this invention to provide a switch for connecting AC power to a load and for disconnecting the load after a preselected time.

It is a further object of this invention to provide a timed switch for an AC load which may be mounted in a standard switch box and connected in the normal manner.

These and other objects are achieved in a timed AC switch that includes a manual switch which has an on and an off position, and a bidirectional semiconductor switch such as a triac connected in series with the manual switch to be connected in series with an AC source and a load. The semiconductor switch is controlled by an oscillator having a frequency greater than the AC source. A timer provides a different timed output signal on each of a number of output leads, one or more of which are selectively coupled to a inhibit circuit which inhibits the oscillator at the preselected time.

In accordance with one aspect of the invention, the inhibit circuit may first inhibit the oscillator for a period of a number of cycles at a first preselected time and, second inhibit the oscillator for an indefinite period of time at a second preselected time.

In addition, the timer in the timed switch is reset when the manual switch is initially closed and may also be reset during operation or when the timer as timed out.

In accordance with another aspect of the invention the timer may include a counter driven either by a separate oscillator or by the oscillator which controls the bidirectional switch. The outputs of the counter stages provide the timing signals for the inhibit circuit.

In accordance with a further aspect of this invention, the timed switch may include a circuit connected across the bidirectional semiconductor switch for supplying power to the oscillator and timer.

Many other objects and aspects of the invention will be clear from the detailed description of the drawings.

BRIEF DESCRIPTION OF THE DRAWINGS

In the drawings:

FIG. 2 is a detailed drawing of a timed AC switch in accordance with the present invention.

DETAILED DESCRIPTION

Figure 1:
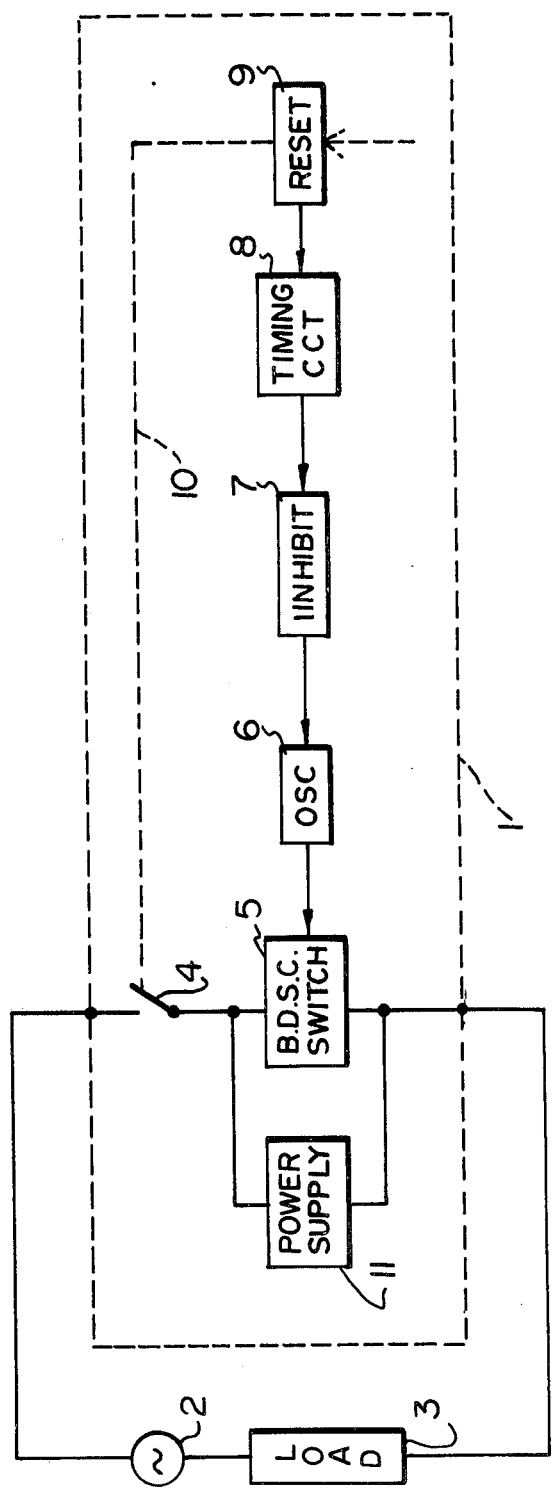
FIG. 1 is a block diagram of the time AC switch.

The timed AC switch 1 as shown in FIG. 1 is to be connected in series with the AC main power supply 2 and the load 3 which would generally be incandescent or fluorescent lamps. The switch 1 includes a mechanical on-off switch 4 in series with a bidirectional semiconductor switch 5 such as a triac or a silicon bilateral switch. The switch 1 further includes an oscillator 6 such as a digital pulse generator for providing a signal to the semiconductor switch to turn it on, and an inhibit circuit 7 for preventing the oscillator circuit 6 from operating. The inhibit circuit 7 is controlled by a timing circuit 8 which determines in a preselected manner the length of time oscillator 6 is allowed to oscillate. Reset circuits 9 are used to reset the timing circuit 8 to recommence the timing cycle. It is desirable to be able to reset the timing circuit either at the end of a cycle, during a cycle or when the switch 4 is closed as represented by broken line 10.

The circuits 6 to 9 are powered by a power supply 11 which is connected across the bidirectional switch 5 and which absorbs power only when switch 4 is closed. Since very low levels of power are required, sufficient power can be obtained during a small portion at the beginning of each AC cycle.

FIG. 2 illustrates a detailed embodiment of the timed switch in accordance with the present invention. It includes a conventional on-off mechanical switch 21 which is closed to connect an AC power source and a load in series with a triac 22.

Power for the control circuits in the timed switch is taken from across the triac 22 through leads 23 and 24 while the tiac 22 is off which is the case when switch 21 is closed and before triac 22 is turned on at the beginning of each cycle. The power supply consists of series capacitor 25 which acts as a reactive, current limiting series element; a half-wave rectifier diode bridge including a parallel diode 26 and a series diode 27; a filter including a series resistor 28 and a parallel capacitor 29; and a zener diode 30 for clamping the voltage at the desired DC level.

The triac 22 is turned on by a pulse signal generated by an RC oscillator. This oscillator includes a portion of a 14521 integrated circuit 31 together with timing resistors 32 and 33 and capacitor 34. The IC 31 may be a Motorola CMOS MSI MC14531B 24-stage frequency divider described in the Motorola semiconductor handbook, which is incorporated herein by reference, pp 7-426 to 7-431, with the oscillator wired in the manner illustrated in FIG. 7 on page 7-430. The oscillator is connected to the triac 22 gate through a gate drive circuit consisting of a current limiting resistor 35, complimentary transistors 36 and 37 and a coupling capacitor 38.

In the present embodiment, the oscillator frequency is set at approximately 2.33 kilohertz. This frequency must be sufficiently high to allow the triggering of triac 22 shortly after the source voltage passes through zero in each half cycle so as not to create flickering in the load lamps. On the other hand, the frequency must be sufficiently low to keep the triac 22 off long enough at the beginning of each cycle to allow the power supply to store enough power to operate the control circuit. The power requirements are low since the control circuitry operates in a pulsating manner and employs CMOS circuitry.

The inhibit circuit for the oscillator consists of a normally non-conducting transistor 39 which is connected between the oscillator timing elements 32, 33 and 34, and ground. When transistor 39 is turned on, the oscillator timing elements 32, 33 and 34 are grounded, inhibiting the oscillator. The triac 22 therefore ceases to be turned on at the beginning of the next half cycle.

The timing circuit consists of the remaining portion of the IC 31 which, when driven at the frequency of the oscillator provides pulse train outputs on terminals 40 to 46 having periods of 56.25 seconds; 1.875 minutes; 3.75 minutes; 7.5 minutes; 15 minutes; 30 minutes; and 60 minutes, respectively. Terminals 40 to 46 are referred to by the pin assignment numbers of 10 to 15 and 1 respectively in the Motorola handbook. In order to operate the inhibit transistor 39, its base is coupled to a selected one of the terminals 40 to 46 which causes the transistor 39 to conduct when a pulse appears at the selected terminal. To achieve this, back to back diodes 47 and 48 are connected between the base of transistor 39 and a lead 49 which is selectively coupled to one of terminals 40–46. Current is provided from the supply through a resistor 50 to the junction of diodes 47, 48. The terminal 40 to 46 to which lead 49 is connected, is normally low, at a ground state, and therefore current through resistor 50 is diverted through diode 48 to ground. Transistor 39 will remain non-conducting. When the terminal 40 to 46 in question provides an output pulse, the current through resistor 40, no longer passes through diode 48 which is back biased. The current now passes through diode 47 to the transistor 39 base, and turns the transistor 39 on, stopping the oscillator.

Under normal operating conditions however, it may be desirable to provide a warning blink a period of time before the triac 22 is turned-off indefinitely. To achieve this, a further diode 51 is connected between the junction of diodes 47 and 48 and a lead 52. A timing circuit consisting of resistor 53, 54 and a capacitor 55 are connected across the diodes 47 and 51. Lead 52 is connected to a selected one of terminals 40 to 46 which determines the length of time from the initial setting of the counter in IC 31 to when the blink occurs and lead 49 is connected to a second one of the terminals 40 to 46 which determines the length of time from the blink to time-out. Since both diodes 48 and 51 are connected to resistor 50, both terminals 40 to 46 to which they are connected must be high before diode 47 will conduct and turn on transistor 39. Thus, if lead 49 is connected to terminal 42, it will go high every 3.75 minutes, but transistor 39 will not be turned on unless lead 52 is also high. Lead 52 could, for example, be connected to terminal 46 and will go high after 60 minutes but not at the same time as lead 49 and, therefore, the current through resistor 50 is diverted to ground. However, when lead 52 receives a pulse, capacitor 55 is charged and this charge turns transistor 39 on via resistor 53 for a duration of approximately $$C_{55} \times \frac{R_{53} \times R_{54}}{R_{53} + R_{54}}$$

seconds. With lead 49 connected to terminal 46, transistor 39 will turn on after 60 minutes to cause the load lamps to blink. The lamps are then turned off completely a preselected time after the blink when lead 49 goes high, both diodes 48 and 51 being back-biased.

Diode 47 then conducts, turning on transistor 39 and turning off the oscillator. The counter in IC 31, therefore, ceases to count until it is reset and until the oscillator is uninhibited.

In the present embodiment, the counter may be reset by placing a reset voltage on terminal 56 of the IC 31 in any of three different ways depending on the time of the switching cycle the switch is in. For a power-up reset, switch 21 is closed and an initial charge is placed on capacitor 57, this charge places a reset voltage on terminal 56 through a diode 58. For an operational reset, a switch 59 is momentarily closed to couple line pulses from capacitor 25 through a capacitor 60 to reset terminal 56 in IC 31. This resets the counter without noticeably inhibiting the oscillator and without causing the triac 22 to shutoff.

The third system for resetting the counter will be used after the counter has timed out, i.e. triac 22 is no longer conducting, but with the mechanical switch 22 in the on position. The system includes transistor circuit 61 properly biased to conduct with switch 21 being closed. This transistor circuit 61 maintains at ground level the junction 65 between a resistor 62 connected across capacitor 29, a capacitor 63 connected to ground and a biased transistor 64 connected to terminal 56. After the timing circuit times-out, capacitor 29 remains charged, thus when switch 21 is opened, transistor 64 no longer conducts, raising junction 65 from the ground level and allowing capacitor 29 to discharge through resistor 62. This causes transistor 64 to conduct placing a voltage on reset terminal 56.

Many modifications in the above described embodiments of the invention can be carried out without departing from the scope thereof and, therefore, the scope of the present invention is intended to be limited only by the appended claims.

We claim:

1. A timed AC switch comprising:
   manual switch means having an on and an off position;
   bidirectional semiconductor switch means connected in series with the manual switch means for connection in series with an AC source and a load;
   oscillator means coupled to the bidirectional switch means having a frequency greater than the AC source for controlling the conduction of the switch means;
   timing means for providing a different timed output signal on each of a number of output leads; and
   inhibit circuit means selectively coupled to at least one of the timing means output leads to inhibit the oscillator means at the preselected time.

2. A timed AC switch as claimed in claim 1 wherein the inhibit circuit means includes first means for inhibiting the oscillator means for a period of a number of cycles at a first preselected time and second means for inhibiting the oscillator means for an indefinite period of time at a second preselected time.

3. A timed AC switch as claimed in claim 1 or 2 which further includes means for resetting the timing means during operation.

4. A timed AC switch as claimed in claim 1 or 2 which further includes means for resetting the timing means when the manual switch means is initially closed.

5. A timed AC switch as claimed in claim 1 or 2 which further includes means for resetting the timing means when the timing means has timed out.

6. A timed AC switch as claimed in claim 1 wherein the oscillator means consists of an RC oscillator providing a pulse train output signal of frequency f, the frequency f being greater than the frequency of the AC source.

7. A timed AC switch as claimed in claim 6 wherein the timing means includes a counter driven by an oscillator, the output leads being the outputs of the counter stages.

8. A timed AC switch as claimed in claim 6 wherein the timing means includes a counter driven by the RC oscillator, the output leads being the outputs of the counter stages.

9. A timed AC switch as claimed in claim 1, 2 or 8 which further includes means connected across the bidirectional semiconductor switch means for supplying power to the oscillator means and timing means.

* * * * *